United States Patent
Jang et al.

(10) Patent No.: US 6,372,664 B1
(45) Date of Patent: Apr. 16, 2002

(54) CRACK RESISTANT MULTI-LAYER DIELECTRIC LAYER AND METHOD FOR FORMATION THEREOF

(75) Inventors: Syun-Ming Jang, Hsin-Chu; Chu-Yun Fu, Taipei; Chen-Hua Yu, Hsin-Chu, all of (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/419,104

(22) Filed: Oct. 15, 1999

(51) Int. Cl.[7] .................. H01L 21/31; H01L 21/469
(52) U.S. Cl. ............... 438/778; 438/624; 438/787; 438/788
(58) Field of Search .................. 438/788, 778, 438/624, 789, 790, 787, 760

(56) References Cited

U.S. PATENT DOCUMENTS

| | | | |
|---|---|---|---|
| 5,366,850 A | * 11/1994 | Chen et al. | 430/314 |
| 5,494,854 A | 2/1996 | Jain | 438/692 |
| 5,503,882 A | * 4/1996 | Dawson | 427/579 |
| 5,607,773 A | 3/1997 | Ahlburn et al. | 428/427 |
| 5,679,606 A | 10/1997 | Wang et al. | 438/763 |
| 5,786,262 A | 7/1998 | Jang et al. | 438/424 |
| 5,814,564 A | 9/1998 | Yao et al. | 438/723 |
| 5,872,064 A | * 2/1999 | Huff et al. | 438/778 |
| 5,904,566 A | * 5/1999 | Tao et al. | 438/689 |
| 6,013,584 A | * 1/2000 | M'saad | 438/783 |
| 6,017,780 A | * 1/2000 | Roy | 438/152 |
| 6,037,251 A | * 3/2000 | Tu et al. | 438/626 |
| 6,100,202 A | * 8/2000 | Lin et al. | 438/734 |

* cited by examiner

Primary Examiner—Wael Fahmy
Assistant Examiner—Hsien-Ming Lee
(74) Attorney, Agent, or Firm—George O. Saile; Stephen B. Ackerman; Stephen G. Stanton

(57) ABSTRACT

A method for forming upon a substrate employed within a microelectronics fabrication a dieletric layer with improved physical properties. There is first provided a substrate. There is then formed over the substrate a series of lines which constitute a patterned microelectronics layer. There is then formed over the patterned microelectronics layer and substrate a conformal dielectric layer. There is then formed over the substrate a second dielectric layer. There is then formed over the substrate a third dielectric layer formed of silicon oxide dielectric material employing high density plasma chemical vapor deposition (HDP-CVD) to complete a composite inter-level metal dielectric (IMD) layer. A fourth dielectric layer formed employing silicon containing dielectric material may be formed over the substrate and third dielectric layer to complete an inter-level metal dielectric (IMD) layer. The fourth dielectric layer is inhibited from cracking by the presence of the third silicon oxide dielectric layer formed by HDP-CVD method.

13 Claims, 3 Drawing Sheets

CRACK RESISTANT MULTI-LAYER DIELECTRIC LAYER AND METHOD FOR FORMATION THEREOF

BACKGROUND OF THE INVENTION

1. Field of the Invention

The invention relates to the field of manufacture of microelectronics fabrications. More particularly, the invention relates to the field of dielectric layers employed as inter-level metal dielectric (IMD) layers within microelectronics fabrications.

2. Description of the Related Art

Microelectronics fabrications employ patterned conductor layers to interconnect the various components out of which the microelectronics fabrications are built. As the density of components has increased and the dimensions of the components and interconnections of microelectronics fabrications have decreased, it has become necessary to employ multiple levels of interconnections to accomplish the wiring of the circuits of the microelectronics fabrication.

The conductor layers employed for interconnection levels in microelectronics fabrications are insulated from each other by dielectric layers formed between, over and under the interconnection levels and components. It is often necessary to separate a lower interconnection level from an upper level with a dielectric layer which may be required to have a number of properties. For instance, it is important that the upper surface of the dielectric layer be planar for photolithographic fabrication of the upper level patterned conductor layer. It is also critical that the physical integrity of the dielectric layer be sufficiently high to meet the design requirements of the microelectronics fabrication. The particular value of the dielectric constant of the dielectric layer may also be an important consideration.

For these and other reasons, the dielectric layer of an inter-level metal dielectric (IMD) layer employed in a microelectronics fabrication may in fact consist of several sub-layers of similar or different dielectric materials combined to obtain the desired properties. Various combinations are known in the art of silicon containing dielectric materials formed by different methods employed in a particular IMD layer, or of low dielectric constant organic polymer dielectric material employed in combination with silicon containing dielectric materials to achieve a particular result.

It is necessary to take into account the difference in both intrinsic material properties as well as the different methods of forming dielectric layers in order to employ properly combinations of materials and/or formation processes. Although combination of materials and methods are generally satisfactorily employed in forming inter-level metal dielectric (IMD) layers, such combination dielectric layers are not without problems.

The formation of a dense void-free layer of dielectric material on a substrate is often complicated by the need to cover over a variable topography of the substrate. In particular, the filling in of narrow gaps between features on a substrate surface with a high quality dielectric material may require a method of deposition which is not compatible with obtaining a planar surface. On the other hand, methods of formation which are suitable for gap filling may produce layers of dielectric material with inferior physical or electrical properties.

It is therefore towards the goal of forming an inter-level metal dielectric (IMD) layer with acceptable physical and electrical properties upon a substrate employed within a microelectronics fabrication that the present invention is generally and specifically directed.

Various methods have been disclosed for forming dielectric layers and specifcally inter-level metal dielectric (IMD) layers upon substrates employed within microelectronics fabrications.

For example, Jain, in U.S. Pat. No. 5,494,854, discloses a method for forming a dielectric layer stack within a microelectronics fabrication with enhanced plananzation of the uppermost layer. The composite dielectric stack consists of a conformal seed dielectric layer formed over the substrate, followed by a silicon dioxide layer formed by HDP-CVD methods, and finally a polishable layer of silicon oxide formed by plasma enhanced CVD from TEOS and dopant gases.

Further, Ahlburn et al., in U.S. Pat. No. 5,607,773, disclose a method for forming a dielectric stack layer upon a microelectronics fabrication with a low dielectric constant. The method employs a first silicon oxide dielectric layer formed employing plasma enhanced CVD of TEOS, followed by a low dielectric constant dielectric layer formed employing hydrogen silsesquioxane spin-on-glass (SOG) dielectric material, and finally a silicon oxide dielectric layer formed employing plasma enhanced CVD of TEOS.

Further still, Wang et al., in U.S. Pat. No. 5,679,606, disclose a method for forming a dielectric stack layer over interconnection lines upon a substrate wherein the first layer does not etch the substrate. The first silicon oxide dielectric layer is formed employing electron cyclotron resonance (ECR) without argon, followed by a gap filling silicon oxide layer formed by ECR with argon and RF power, and repeating the two formation processes until the desired thickness is built up.

Yet further still, Jang et al., in U.S. Pat. No. 5,786,262, disclose a method for forming a gap filling silicon oxide layer for filling shallow isolation trenches. The method employs an ozone assisted sub-atmospheric pressure thermal chemical vapor deposition (SACVD) method with TEOS to form the gap filling silicon oxide layer.

Still further, Yao et al., in U.S. Pat. No. 5,814,564, disclose a method for planarizing a dielectric stack layer consisting of a low dielectric constant dielectric spin-on-glass (SOG) layer formed over a silicon oxide dielectric layer. The silicon oxide layer is formed employing a high density plasma chemical vapor deposition (HDP-CVD) method. The planarization is carried out by a succession of etch back processes involving plasmas.

Finally, Huff et al., in U.S. Pat. No. 5,872,064, disclose a method for forming a dielectric stack layer with few voids and with compressive internal stress. The method employs a first conformal silicon oxide dielectric seed layer formed employing PECVD from TEOS, followed by a gap filling silicon oxide dielectric layer formed employing SACVD. The resulting stack is then sputter etched in argon to redistribute the silicon oxide dielectric material whose tensile stress balances the compressive stress of the seed layer and produce the final resulting compressive stress within the stack.

Desirable in the art of microelectronics fabrication are additional methods for forming inter-level metal dieletric (IMD) layers within substrates employed within microelectronics fabrications.

It is towards this goal that the present invention is generally and more specifically directed.

SUMMARY OF THE INVENTION

It is a first object of the present invention to provide a method for forming a dielectric layer upon a substrate employed within a microelectronics fabrication with optimized physical and dielectric properties.

It is a second object of the present invention to provide a method in accord with the first object of the present invention, where there is formed a composite inter-level metal dielectric (IMD) layer upon a semiconductor substrate employed within an integrated circuit microelectronics fabrication.

It is a third object of the present invention to provide a method in accord with the first and/or the second object of the present invention, where the present invention is readily commercially implemented.

In accord with the objects of the present invention, there is provided a method for forming upon a substrate employed within a microelectronics fabrication a composite inter-level metal (IMD) dielectric layer with optimized physical properties. To practice the invention, there is provided a substrate employed within a microelectronics fabrication. There is formed upon the substrate a patterned microelectronics layer. There is then formed upon the substrate a silicon oxide dielectric layer employing plasma enhanced chemical vapor deposition (PECVD). There is then formed over the silicon oxide layer a second dielectric silicon oxide layer formed employing ozone assisted sub-atmospheric pressure thermal chemical vapor deposition (SACVD) from tetra-ethyl-orthosilicate (TEOS). Finally, a silicon oxide dielectric layer is formed over the substrate employing a high density plasma chemical vapor deposition (HDP-CVD) method. An additional silicon oxide layer formed employing PECVD may be formed over the third layer of HDP-CVD silicon oxide if desired.

The present invention provides a method for forming over a substrate employed within a microelectronics fabrication a composite inter-level metal dielectric (IMD) layer with optimized physical properties. The present invention may be employed with beneficial effect within microelectronics fabrications including but not limited to integrated circuit microelectronics fabrications, charge coupled device microelectronics fabrications, solar cell microelectronics fabrications, ceramic substrate microelectronics fabrications and flat panel display microelectronics fabrications.

The present invention employs materials and methods as are known in the art of microelectronics fabrications, but in a novel and original arrangement and sequence. The present invention is therefore readily commercially implemented.

BRIEF DESCRIPTION OF THE DRAWINGS

The objects, features and advantages of the present invention are understood within the context of the Description of the Preferred Embodiments as set forth below. The Description of the Preferred Embodiments is understood within the context of the accompanying drawings, which form a material part of this disclosure, wherein:

FIG. 1 to FIG. 3 illustrate the formation upon a substrate employed within a microelectronics fabrication of a dielectric layer with optimized physical properties.

FIG. 4 to FIG. 7 illustrate the formation upon a semiconductor substrate employed within an integrated circuit microelectronics fabrication of a composite inter-level metal dielectric (IMD) layer with improved physical properties.

DESCRIPTION OF THE PREFERRED EMBODIMENTS

The present invention provides a method for the formation upon a substrate employed within a microelectronics fabrication of a dielectric layer with optimized physical properties.

First Preferred Embodiment

Figure 1:
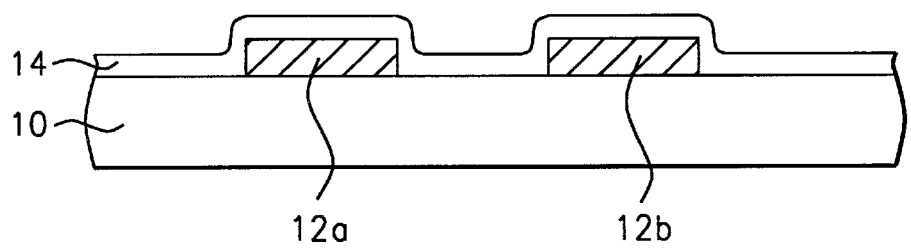
FIG. 1, FIG. 2 and FIG. 3 are directed towards a general embodiment of the present invention which constitutes a first preferred embodiment of the present invention.
Figure 2:
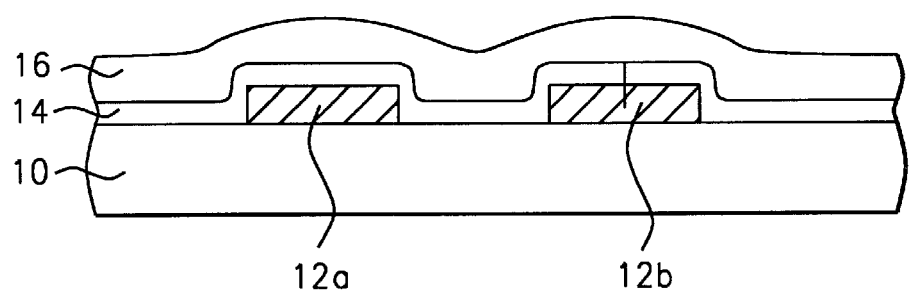
Figure 3:
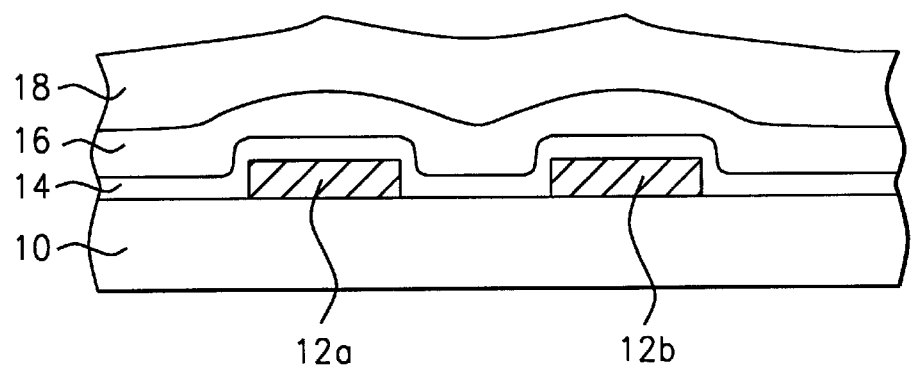

Referring now more particularly to FIG. 1 to FIG. 3, there is shown a series of schematic cross-sectional diagrams illustrating the results of forming, in accord with a general embodiment of the present invention which constitutes a first preferred embodiment of the present invention, upon a substrate employed within a microelectronics fabrication a dielectric layer with optimized physical properties. FIG. 1 is a schematic cross-sectional diagram of a microelectronics fabrication at an early stage in its fabrication in accord with the first preferred embodiment of the present invention.

Shown in FIG. 1 is a substrate 10 upon which is formed a series of lines 12a and 12b which form a patterned microelectronics layer. Formed over the substrate is a dielectric layer 14.

With respect to the substrate 10 shown in FIG. 1, the substrate 10 may be the substrate itself employed within the microelectronics fabrication, or alternately the substrate 10 may additionally comprise any of several microelectronics layers formed upon the substrate. The substrate may be formed of microelectronics materials including but not limited to microelectronics conductor materials, microelectronics semiconductor materials and microelectronics dielectric materials. Preferably the substrate 10 is a semiconductor substrate.

With respect to the series of lines 12a and 12b forming the patterned microelectronics layer shown in FIG. 1, the series of lines 12a and 12b may be formed of materials selected from microelectronics conductor materials, microelectronics semiconductor materials and microelectronics dielectric materials. Preferably, the series of lines 12a and 12b forming the patterned microelectronics layer are formed of a conductor material such as, for example, aluminum.

With respect to the dielectric layer 14 shown in FIG. 1, the dielectric layer 14 is a conformal silicon oxide dielectric layer. Preferably the silicon oxide dielectric layer 14 is formed employing plasma enhanced chemical vapor deposition (PECVD) in accord with the following process conditions: (1) silane ($SiH_4$) source gas at a flow rate of about 100 to about 150 standard cubic centimeters per minute (sccm); (2) nitrous oxide ($N_2O$) oxidizing gas at a flow rate of about 1000 to about 1500 standard cubic centimeters per minute (sccm); (3) power of about 250 to about 300 watts; (4) temperature of about 400 degrees centigrade; (5) pressure of about 2 to about 2.5 Torr; and (6) electrode separation of about 0.4 to about 0.45 inches. Preferably the silicon oxide dielectric layer 14 is formed without prior exposure of the substrate to any plasma. The silicon oxide dielectric layer 14 is preferably formed to a thickness of from about 500 to about 1200 angstroms.

Referring now more particularly to FIG. 2, there is shown a schematic cross-sectional diagram illustrating the results of further processing of the microelectronics fabrication whose schematic cross-sectional diagram is shown in FIG. 1 in accord with the first preferred embodiment of the present invention. Shown in FIG. 2 is a microelectronics fabrication otherwise equivalent to the microelectronics fabrication shown in FIG. 1, but where there has been formed over the substrate a second conformal dielectric layer 16.

With respect to the second conformal dielectric layer 16 shown in FIG. 2, the second conformal dielectric layer 16 is a gap filling silicon oxide dielectric layer formed employing sub-atmospheric pressure thermal chemical vapor deposition (SACVD) or near-atmospheric pressure chemical vapor deposition (APCVD) with ozone/tetra-ethyl-ortho-silicate (TEOS) gases in accord with the following process conditions: (1) ozone gas flow rate about 4500 to about 5500 standard cubic centimeters per minute (sccm); (2) TEOS gas flow rate of about 250 to about 300 milligrams per minute (mg/min); (3) total pressure about 400 to about 500 Torr; (4) temperature about 400 degrees centigrade; (5) helium carrier gas at a flow rate of about 3500 to about 4500 standard cubic centimeters per minute (sccm); and (6) electrode separation of about 0.2 to about 0.25 inches. The second conformal silicon oxide dielectric layer 16 is preferably formed without prior sputtering or plasma exposure of the underlying substrate. Preferably the second conformal silicon oxide dielectric layer 16 is formed to a thickness of from about 2000 to about 6000 angstroms, depending on the height of the underlying patterned layer.

Referring now more particularly to FIG. 3, there is shown a schematic cross-sectional diagram illustrating the results of further processing of the microelectronics fabrication whose schematic cross-sectional diagram is shown in FIG. 2 in accord with the method of the first preferred embodiment of the present invention. Shown in FIG. 3 is a microelectronics fabrication otherwise equivalent to the microelectronics fabrication shown in FIG. 2, but where there has been formed over the substrate a third non-conformal dielectric layer 18.

With respect to the third dielectric layer 18 shown in FIG. 2, the third dielectric layer 18 is a silicon oxide dielectric layer formed employing high density plasma chemical vapor deposition (HDP-CVD). Preferably the HDP-CVD method employs the following process: (1) silane ($SiH_4$) source gas at a flow rate of about 50 to about 80 standard cubic centimeters per minute (sccm); (2) $O_2$ oxidizing gas at a flow rate of about 90 to about 120 standard cubic centimeters per minute (sccm); (3) argon gas at a flow rate of about 110 to about 130 standard cubic centimeters per minute(sccm); (4) temperature about 400 degrees centigrade; (5) pressure about 6 to about 9 Torr; (6) radiofrequency (RF) power about 1000 to about 1500 watts (source power) and about 3000 to about 3500 watts (side power); and about 2000 to about 3000 watts (bias power). Preferably the third silicon oxide dielectric layer 18 is formed to a thickness of from about 5000 to about 9000 angstroms.

The present invention provides a method for forming upon a substrate employed within a microelectronics fabrication a dielectric layer with optimized physical properties. The conformal nature of the underlying first and second dielectric layers are compensated for by the non-conformal combined sputter-deposition processes inherent in the HDP-CVD method, and hence any narrow crevices or cracks are filled in by the dense silicon oxide material produced by the HDP-CVD method, so that no cracks, crevices or voids are formed to act as weak, points in the composite dielectric layer.

Second Preferred Embodiment

Figure 4:
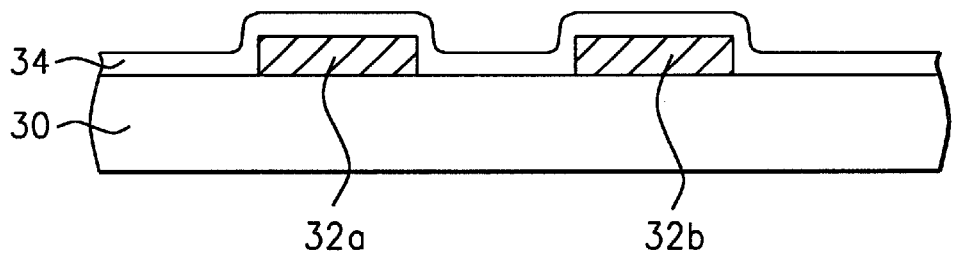
FIG. 4, FIG. 5, FIG. 6 and FIG. 7 are directed towards a more specific embodiment of the present invention which constitutes a second preferred embodiment of the present invention.

Referring now to FIG. 4 to FIG. 7, there is shown a series of schematic cross-sectional diagrams illustrating the results of forming in accord with a more specific embodiment of the present invention which constitutes a second preferred embodiment of the present invention, upon a semiconductor substrate employed within an integrated circuit microelectronics fabrication a composite inter-level metal dielectric (IMD) layer with optimized physical properties. FIG. 4 is a schematic cross-sectional diagram of an integrated circuit microelectronics fabrication at an early stage in its fabrication in accord with the second preferred embodiment of the present invention.

Shown in FIG. 4 is a semiconductor substrate 30 upon which is formed a series of conductor lines 32a and 32b which constitute a patterned microelectronics conductor layer. Formed over the semiconductor substrate is a conformal dielectric layer 34.

With respect to the semiconductor substrate 30 shown in FIG. 4, the semiconductor substrate 30 is a silicon semiconductor substrate. Preferably the silicon substrate is a (100) crystalline orientation single crystal silicon substrate with either P- or N-type doping. Although not shown in FIG. 4, the semiconductor substrate 30 may contain within it typical microelectronics devices such as, for example, field effect transistor (FET) devices.

With respect to the series of conductor lines 34a and 34b which together constitute a patterned microelectronics conductor layer, the series of lines 32a and 32b is equivalent or analogous to the series of lines 12a and 12b shown in FIG. 1 of the first preferred embodiment of the present invention.

With respect to the conformal dielectric layer 34 shown in FIG. 4, the conformal dielectric layer is a silicon oxide dielectric layer equivalent or analogous to the silicon oxide layer 14 shown in FIG. 1 of the first preferred embodiment of the present invention.

Figure 5:
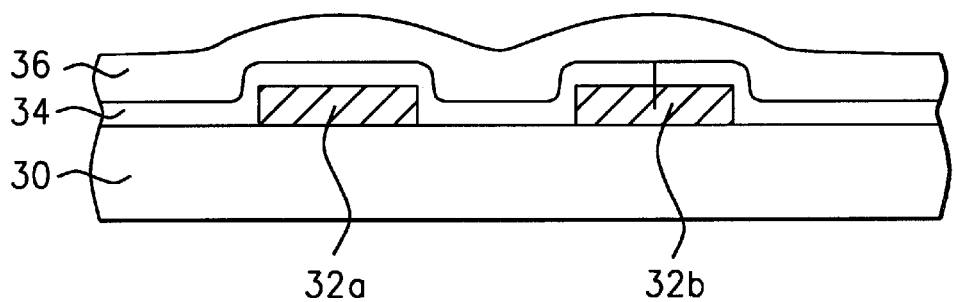

Referring now more particularly to FIG. 5, there is shown a schematic cross-sectional diagram illustrating the results of further processing of the integrated circuit microelectronics fabrication whose schematic cross-sectional diagram is shown in FIG. 4 in accord with the second preferred embodiment of the present invention. Shown in FIG. 5 is an integrated circuit microelectronics fabrication otherwise equivalent to the integrated circuit microelectronics fabrication shown in FIG. 4, but where there has been formed over the semiconductor substrate a second dielectric layer 36.

With respect to the second dielectric layer 36 shown in FIG. 5, the second dielectric layer 36 is a silicon oxide dielectric layer equivalent or analogous to the second silicon oxide dielectric layer 16 shown in FIG. 2 of the first preferred embodiment of the present invention. Preferably the second dielectric layer 36 is formed to a thickness of from about 2000 to about 6000 angstroms, depending on the height of the patterned underlying microelectronics conductor layer.

Figure 6:
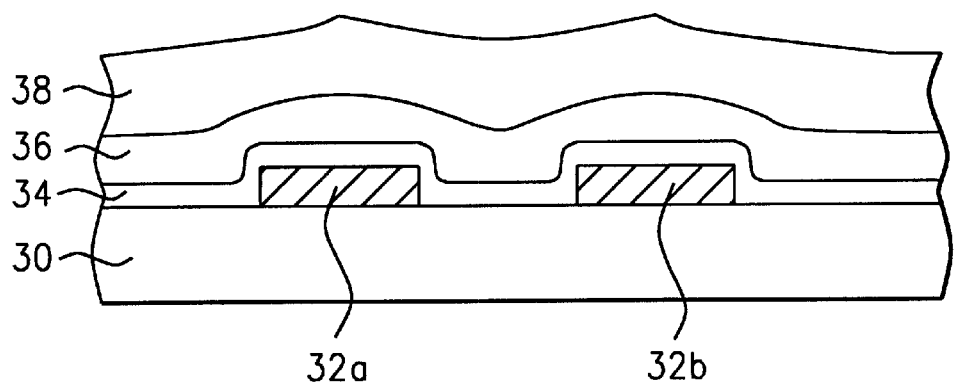

Referring now more particularly to FIG. 6, there is shown a schematic cross-sectional diagram illustrating the results of further processing of the integrated circuit microelectronics fabrication whose schematic cross-sectional diagram, is shown in FIG. 5 in accord with the second preferred embodiment of the present invention. Shown in FIG. 6 is an integrated circuit microelectronics fabrication otherwise equivalent to the integrated circuit microelectronics fabrication shown in FIG. 5, but where there has been formed over the semiconductor substrate a third silicon oxide dielectric layer 38.

With respect to the third dielectric layer 38 shown in FIG. 6, the third dielectric layer is a silicon oxide dielectric layer equivalent or analogous to the third dielectric layer 18 shown in FIG. 3 of the first preferred embodiment of the present invention. Preferably the third silicon oxide dielectric layer 38 is formed to a thickness of at least about 2000 angstroms.

Figure 7:
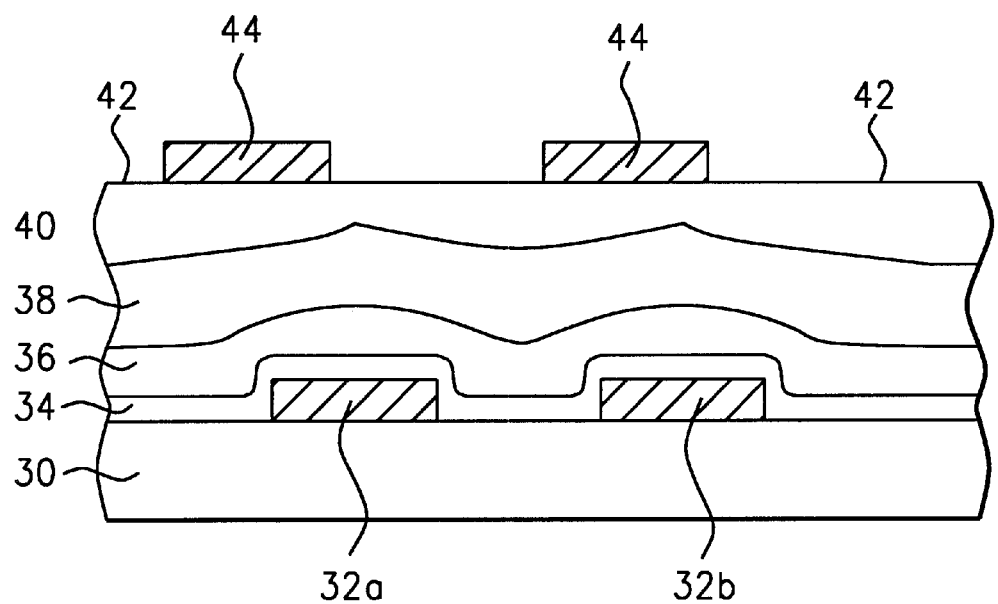

Referring now more particularly to FIG. 7, there is shown a schematic cross-sectional diagram illustrating the results of final processing of the integrated circuit microelectronics fabrication whose schematic cross-sectional diagram is shown in FIG. 6 in accord with the second preferred embodiment of the present invention. Shown in FIG. 7 is an integrated circuit microelectronics fabrication otherwise equivalent to the integrated circuit microelectronics fabrication shown in FIG. 6, but where there has been formed over the substrate a dielectric layer 40 whose surface 42 has been planarized by chemical mechanical polish (CMP) planarization. Formed over the planarized surface is a patterned microelectronics conductor layer 44.

With respect to the dielectric layer 40 shown in FIG. 7, the dielectric layer 40 is a analogous to the dielectric layer 14 shown in FIG. 1 of the first embodiment of the present invention or the dielectric layer 34 shown in FIG. 4 of the second embodiment of the present invention, but much thicker. The dielectric layer 40 is formed of silicon containing dielectric material employing methods known in the art of microelectronics fabrication. Preferably the silicon containing dielectric material is formed employing plasma enhanced chemical vapor deposition (PECVD). Preferably the silicon containing dielectric layer 40 is formed to a thickness of about 3000 to about 7000 angstroms.

With respect to the planarized surface 42 of the silicon containing dielectric layer 40 shown in FIG. 7, the planarized surface 42 is formed employing chemical mechanical polish (CMP) methods as are known and practiced in the art of microelectronics fabrication.

With respect to the patterned microelectronics conductor layer 44 shown in FIG. 7, the patterned microelectronics conductor layer 44 is analogous to the series of lines 12a and 12b which form the patterned microelectronics layer shown in FIG. 1 of the first preferred embodiment of the present invention or the series of patterned conductor lines 32a and 32b which form a patterned microelectronics layer shown in FIG. 4 of the second preferred embodiment of the present invention. The patterned microelectronics layer 44 is formed employing methods and materials as are known in the art of microelectronics fabrication. Preferably the patterned microelectronics conductor layer 44 is a conductor layer of aluminum-copper alloy formed employing physical vapor deposition (PVD) sputtering method of deposition and patterned employing methods and materials as are known and practiced in the art of microelectronics fabrication.

The second preferred embodiment of the present invention provides a method for forming a composite inter-level metal dielectric (IMD) layer with improved physical properties upon a semiconductor substrate employed within an integrated circuit microelectronics fabrication. The dielectric layer 38 formed employing high density plasma chemical vapor deposition (HDP-CVD) over the substrate 30 and series of patterned lines 32a and 32b results in inhibition of cracking of the dielectric layer 40 deposited over to substrate and particularly over and between the patterned series of lines 32a and 32b, compared with an otherwise equivalent structure without a dielectric layer such as the dielectric layer 38.

The thickness of the third silicon oxide dielectric layer 38 may be reduced substantially while still retaining the benefit of its presence by employing the fourth dielectric layer. Reducing the thickness of the third dielectric layer 38 diminishes the total time of exposure of the substrate and underlying layers to bombardment by species from the HDP-CVD environment, hence reducing the possibility of damage and reducing the cost per wafer, since the HDP-CVD process is inherently more expensive than PECVD.

As is understood by a person skilled in the art, the several embodiments of the present invention are illustrative of the present invention rather than limiting of the present invention. Revisions and modifications may be made to materials, structures and dimensions through which is provided the preferred embodiments of the present invention while still providing embodiments which are within the spirit and scope of the present invention, as defined by the appended claims.

What is claimed is:

1. A method for forming upon a substrate employed within a microelectronics fabrication a dielectric layer comprising:

providing a substrate;

forming upon the substrate a series of lines which constitute a patterned microelectronics layer;

forming over the substrate a first conformal dielectric layer having a thickness of from about 500 to 1200 Å; the first conformal dielectric layer formed employing a PECVD method using:

a silane gas flow rate from about 100 to 150 sccm;

a nitrous oxide gas flow rate from about 1000 to 1500 sccm;

a power of from about 250 to 300 watts;

a temperature of about 400° C.;

a total pressure of from about 2 to 2.5 Torr; and an electrode separation of from about 0.4 to 0.45 inches;

forming over the first dielectric layer a second dielectric layer having a thickness of from about 2000 to 6000 Å; the second dielectric layer formed employing an APCVD method with ozone/TEOS gases using:

an ozone gas flow rate from about 4500 to 5500 sccm a TEOS gas flow rate from about 250 to 300 mg/min;

a helium carrier gas flow rate from about 3500 to 4500 sccm;

a total pressure of from about 400 to 500 Torr; and an electrode separation of from about 0.2 to 0.25 inches; and forming over the substrate a third non-conformal dielectric layer having a thickness of from about 5000 to 9000 Å; the third non-conformal dielectric layer formed employing the method of high-density plasma chemical vapor deposition (HDP-CVD) using:

a silane source gas flow rate from about 50 to 80 sccm;

an $O_2$ oxidizing gas flow rate from about 90 to 120 sccm;

an argon gas flow rate from about 110 to 130 sccm;

a temperature of about 400° C.;

a total pressure of from about 6 to 9 Torr; and an RF power of from about 1000 to 1500 watts source power, from about 3000 to 3500 watts side power, and from about 2000 to 3000 bias power.

2. The method of claim 1 wherein the substrate is employed within a microelectronics fabrication chosen from the group consisting of:

integrated circuit microelectronics fabrications;

charge coupled device microelectronics fabrications;

solar cell microelectronics fabrications;

ceramic substrate microelectronics fabrications; and flat panel display microelectronics fabrications.

3. The method of claim 1 wherein the substrate is formed from microelectronics materials chosen from the group consisting of:

microelectronics conductor materials;

microelectronics semiconductor materials; and microelectronics dielectric materials.

4. The method of claim 1 wherein the first conformal dielectric layer is a silicon oxide dielectric layer.

5. The method of claim 1 wherein the second dielectric layer is a silicon oxide dielectric layer.

6. The method of claim 1 wherein the third dielectric layer is a silicon oxide dielectric layer.

7. The method of claim 1 further comprising an additional fourth dielectric layer formed over the substrate having a thickness of from about 3000 to 7000 Å, the fourth dielectric layer employing a sub-atmospheric pressure thermal chemical vapor deposition (SACVD) or a near-atmospheric pressure chemical vapor deposition (APCVD) using:

an ozone gas flow rate from about 4500 to 5500 sccm a TEOS gas flow rate from about 250 to 300 mg/min;

a helium carrier gas flow rate from about 3500 to 4500 sccm;

a total pressure of from about 400 to 500 Torr; and an electrode separation of from about 0.2 to 0.25 inches.

8. The method of claim 7 wherein by employing the third dielectric layer formed employing the high density plasma chemical vapor deposition (HDP-CVD), there is inhibited cracking of the fourth dielectric layer.

9. A method for forming upon a semiconductor substrate employed within an integrated circuit microelectronics fabrication a composite inter-level metal (IMD) dielectric layer comprising:

providing a semiconductor substrate;

forming upon the semiconductor substrate a series of conducting lines which constitute a first patterned microelectronics conductor layer;

forming upon the substrate a conformal silicon oxide dielectric layer having a thickness of from about 500 to 1200 Å; the conformal silicon oxide dielectric layer formed employing a PECVD method using:

a silane gas flow rate from about 100 to 150 sccm;

a nitrous oxide gas flow rate from about 1000 to 1500 sccm;

a power of from about 250 to 300 watts;

a temperature of about 400° C.;

a total pressure of from about 2 to 2.5 Torr; and an electrode separation of from about 0.4 to 0.45 inches;

forming over the substrate and conformal silicon oxide dielectric layer a second dielectric layer having a thickness of from about 2000 to 6000 Å; the second dielectric layer formed employing an APCVD method with ozone/TEOS gases using:

an ozone gas flow rate from about 4500 to 5500 sccm a TEOS gas flow rate from about 250 to 300 mg/min;

a helium carrier gas flow rate from about 3500 to 4500 sccm;

a total pressure of from about 400 to 500 Torr; and an electrode separation of from about 0.2 to 0.25 inches; and forming over the substrate and second dielectric layer a third dielectric layer having a thickness of at least about 2000 Å; the third non-conformal dielectric layer formed employing the method of high-density plasma chemical vapor deposition (HDP-CVD) using:

a silane source gas flow rate from about 50 to 80 sccm;

an $O_2$ oxidizing gas flow rate from about 90 to 120 sccm;

an argon gas flow rate from about 110 to 130 sccm;

a temperature of about 400° C.;

a total pressure of from about 6 to 9 Torr; and an RF power of from about 1000 to 1500 watts source power, from about 3000 to 3500 watts side power, and from about 2000 to 3000 bias power.

10. The method of claim 9 further comprising:

forming over the substrate a fourth silicon containing dielectric layer having a thickness of from about 3000 to 7000 Å, the fourth silicon containing dielectric layer employing a sub-atmospheric pressure thermal chemical vapor deposition (SACVD) or a near-atmospheric pressure chemical vapor deposition (APCVD) using:

an ozone gas flow rate from about 4500 to 5500 sccm a TEOS gas flow rate from about 250 to 300 mg/min;

a helium carrier gas flow rate from about 3500 to 4500 sccm;

a total pressure of from about 400 to 500 Torr; and an electrode separation of from about 0.2 to 0.25 inches;

planarizing the silicon containing dielectric layer employing chemical mechanical (CMP) polish planarization method; and forming an upper patterned microelectronics conductor layer over the substrate to complete the formation of an inter-level metal dielectric (IMD) layer.

11. The method of claim 10 wherein the fourth dielectric layer has inhibited cracking due to the presence of the third dielectric layer formed by HDP-CVD method.

12. The method of claim 9 wherein the semiconductor substrate is a silicon semiconductor substrate.

13. The method of claim 9 wherein upper patterned microelectronics conductor layer is formed of aluminum-copper alloy employing the method of physical vapor deposition (PVD).

* * * * *